United States Patent
Ohashi et al.

(10) Patent No.: US 10,342,168 B2
(45) Date of Patent: Jul. 2, 2019

(54) FEEDER

(71) Applicant: FUJI CORPORATION, Chiryu-shi (JP)

(72) Inventors: Hiroyasu Ohashi, Toyota (JP); Takashi Kawatani, Nagoya (JP); Takuya Nagaishi, Okazaki (JP)

(73) Assignee: FUJI CORPORATION, Chiryu-shi (JP)

( * ) Notice: Subject to any disclaimer, the term of this patent is extended or adjusted under 35 U.S.C. 154(b) by 0 days.

(21) Appl. No.: 15/579,657

(22) PCT Filed: Jun. 18, 2015

(86) PCT No.: PCT/JP2015/067665
§ 371 (c)(1),
(2) Date: Dec. 5, 2017

(87) PCT Pub. No.: WO2016/203627
PCT Pub. Date: Dec. 22, 2016

(65) Prior Publication Data
US 2018/0160576 A1 Jun. 7, 2018

(51) Int. Cl.
*B32B 43/00* (2006.01)
*H05K 13/02* (2006.01)
(Continued)

(52) U.S. Cl.
CPC ......... *H05K 13/02* (2013.01); *H05K 13/0417* (2013.01); *H05K 13/0419* (2018.08);
(Continued)

(58) Field of Classification Search
CPC . B32B 38/10; B32B 43/006; Y10T 156/1174; Y10T 156/1184; Y10T 156/195; Y10T 156/1961
(Continued)

(56) References Cited

U.S. PATENT DOCUMENTS

| 6,699,355 B2 * | 3/2004 | Yman | H05K 13/02 |
| | | | 156/701 |
| 7,866,518 B2 * | 1/2011 | Wada | H05K 13/0417 |
| | | | 226/128 |

(Continued)

FOREIGN PATENT DOCUMENTS

| JP | 2011-222569 A | 11/2011 |
| JP | 2013-58512 A | 3/2013 |

(Continued)

OTHER PUBLICATIONS

International Search Report dated Sep. 8, 2015 in PCT/JP2015/067665 filed Jun. 18, 2015.

*Primary Examiner* — Mark A Osele
*Assistant Examiner* — Nickolas R Harm
(74) *Attorney, Agent, or Firm* — Oblon, McClelland, Maier & Neustadt, L.L.P.

(57) ABSTRACT

A feeder includes a discharge guide member which is provided on a feeder main body to communicate with a tape discharging section and guides such that a carrier tape which is discharged from the tape discharging section heads downward, a peeling member which is provided on the feeder main body and peels a cover tape from the carrier tape before the carrier tape which is conveyed by a front side sprocket reaches the tape discharging section, and a contacting and positioning member which is provided on the feeder main body, causes the cover tape which covers the carrier tape which is conveyed by the front side sprocket to contact the peeling member, and positions the carrier tape from which the cover tape is peeled and which is discharged from the tape discharging section at a regular position inside the discharge guide member.

8 Claims, 22 Drawing Sheets

(51) Int. Cl.
*H05K 13/04* (2006.01)
*B32B 38/10* (2006.01)

(52) U.S. Cl.
CPC ............. *B32B 38/10* (2013.01); *B32B 43/006* (2013.01); *Y10T 156/1174* (2015.01); *Y10T 156/1184* (2015.01); *Y10T 156/195* (2015.01); *Y10T 156/1961* (2015.01)

(58) Field of Classification Search
USPC ................................ 156/715, 717, 759, 762
See application file for complete search history.

(56) References Cited

U.S. PATENT DOCUMENTS

| | | | | |
|---|---|---|---|---|
| 7,930,819 B2* | 4/2011 | Yonemitsu | ......... | H05K 13/0417 226/76 |
| 8,715,459 B2* | 5/2014 | Nagao | ............... | H05K 13/0084 156/714 |
| 8,764,935 B2* | 7/2014 | Kinoshita | .......... | H05K 13/0084 156/714 |
| 9,345,186 B2* | 5/2016 | Choi | .................. | H05K 13/0417 |
| 9,414,536 B2* | 8/2016 | Yamasaki | .............. | H05K 13/02 |
| 9,802,399 B2* | 10/2017 | Ohashi | ............... | B32B 38/0004 |
| 9,839,170 B2* | 12/2017 | Murase | .................. | H05K 13/02 |
| 9,913,419 B2* | 3/2018 | Ohashi | ............... | H05K 13/0417 |
| 9,914,609 B2* | 3/2018 | Ohashi | .................. | B65H 20/22 |
| 2007/0241028 A1* | 10/2007 | Larsson | ............... | H05K 13/021 206/714 |
| 2008/0201940 A1* | 8/2008 | Watanabe | .......... | H05K 13/0413 29/740 |
| 2009/0071996 A1* | 3/2009 | Horie | ................ | H05K 13/0417 226/29 |
| 2010/0239401 A1* | 9/2010 | Kim | .................... | B65H 37/002 414/412 |
| 2011/0243695 A1* | 10/2011 | Hwang | ............. | H05K 13/0417 414/412 |
| 2012/0305585 A1* | 12/2012 | Nagao | ................ | H05K 13/0417 221/25 |
| 2013/0161371 A1* | 6/2013 | Nagao | ............... | H05K 13/0417 226/86 |
| 2014/0151490 A1 | 6/2014 | Kobayashi et al. | | |
| 2014/0318713 A1* | 10/2014 | Wiley | .................. | B32B 43/006 156/701 |
| 2015/0195964 A1* | 7/2015 | Yamasaki | .......... | H05K 13/0417 226/76 |
| 2015/0223373 A1* | 8/2015 | Yamasaki | .......... | H05K 13/0417 226/76 |
| 2015/0296669 A1* | 10/2015 | Kitani | ................. | H05K 13/021 221/71 |
| 2016/0185093 A1* | 6/2016 | Ohashi | .............. | H05K 13/0417 156/378 |
| 2016/0192547 A1* | 6/2016 | Ohashi | .............. | H05K 13/0084 242/566 |
| 2016/0192548 A1* | 6/2016 | Ohashi | .............. | H05K 13/0417 156/750 |
| 2016/0205820 A1* | 7/2016 | Ohashi | ................ | H05K 13/021 29/739 |
| 2016/0205821 A1* | 7/2016 | Murase | .............. | H05K 13/0417 226/76 |
| 2016/0219762 A1* | 7/2016 | Ohashi | ................... | B65H 20/20 |
| 2017/0034970 A1* | 2/2017 | Ohashi | ............... | H05K 13/0417 |
| 2017/0183176 A1* | 6/2017 | Ohashi | ................... | B65H 20/20 |
| 2017/0196132 A1* | 7/2017 | Ohashi | ................ | H05K 13/0417 |
| 2017/0347502 A1* | 11/2017 | Ohashi | ................. | H05K 13/021 |
| 2018/0007820 A1* | 1/2018 | Murase | ................. | H05K 13/02 |
| 2018/0042151 A1* | 2/2018 | Ohashi | ............. | H05K 13/0417 |
| 2018/0054928 A1* | 2/2018 | Ohashi | ................... | H05K 13/02 |
| 2018/0146581 A1* | 5/2018 | Ohashi | ............... | H05K 13/0417 |

FOREIGN PATENT DOCUMENTS

| | | |
|---|---|---|
| JP | 2014-93424 A | 5/2014 |
| JP | 2014-112579 A | 6/2014 |

\* cited by examiner

FEEDER

TECHNICAL FIELD

The present application relates to a feeder for conveying a carrier tape in which components are stored.

BACKGROUND ART

PTL 1 describes an auto-loading feeder which, when usage of a current carrier tape ends, automatically conveys a next carrier tape and starts usage of the next carrier tape. A front portion of a feeder main body is provided with a guide member which guides a carrier tape from the feeder main body to a tape discharge duct while in contact with an upper face of the carrier tape when the feeder discharges a carrier tape to a tape discharge duct which is disposed below the front portion of the feeder main body.

The current carrier tape for which usage is ended and which is separated from the sprocket remains inside the guide. Therefore, when the next carrier tape is conveyed into the guide member by the sprocket, the leading end of the next carrier tape contacts the tail end of the current carrier tape, pushes out the current carrier tape and discharges the current carrier tape to the discharge duct.

CITATION LIST

Patent Literature
  PTL 1: JP-A-2014-93424

SUMMARY

Technical Problem

In a feeder of the related art, the upper face side of the discharged carrier tape is restricted by a ceiling surface of the guide member; however, the lower face side of the discharged carrier tape is not restricted since the guide member is hollow. Therefore, the current carrier tape which remains inside the guide member may deviate downward inside the guide member, and in this case, the leading end of the next carrier tape cannot contact the tail end of the current carrier tape and it is not possible to discharge the current carrier tape to the discharge duct.

The present disclosure is made in consideration of the problem described above, and an object is to provide a feeder which is capable of reliably causing the leading end of the next carrier tape to contact the tail end of the current carrier tape.

Solution to Problem

In order to solve the problem described above, a feeder of the present disclosure includes a feeder main body in which a tape insertion section for inserting a carrier tape which stores multiple components and is covered by a cover tape formed at a rear portion of the feeder main body and a tape discharging section for discharging the carrier tape is formed at a front portion of the feeder main body, a tape conveyance path which is provided on the feeder main body to communicate the tape insertion section and the tape discharging section and is for conveying the carrier tape from a rear toward a front, a rear side sprocket which is provided on the feeder main body to be capable of rotating, includes engagement protrusions which are capable of engaging with engagement holes of the carrier tape which is inserted from the tape insertion section, and a rear side sprocket which sequentially conveys a current carrier tape and a next carrier tape along the tape conveyance path, a front side sprocket which is provided on the feeder main body to be capable of rotating, includes engagement protrusions which are capable of engaging with the engagement holes of the carrier tape which is conveyed by the rear side sprocket, and once conveyance of the current carrier tape to the tape discharging section is completed, conveys the next carrier tape which is conveyed thereto by the rear side sprocket to the tape discharging section, a discharge guide member which is provided on the feeder main body to communicate with the tape discharging section and guides such that the carrier tape which is discharged from the tape discharging section heads downward, a peeling member which is provided on the feeder main body and peels the cover tape from the carrier tape before the carrier tape which is conveyed by the front side sprocket reaches the tape discharging section, and a contacting and positioning member which is provided on the feeder main body, causes the cover tape which covers the carrier tape which is conveyed by the front side sprocket to contact the peeling member, and positions the carrier tape from which the cover tape is peeled and which is discharged from the tape discharging section at a regular position inside the discharge guide member.

Accordingly, since it is possible to position the current carrier tape for which usage is completed such that the tail end of the current carrier tape for which usage is completed is capable of contacting the leading end of the next carrier tape for which usage is to start inside the discharge guide member, it is possible to reliably discharge the current carrier tape for which usage is completed.

DESCRIPTION OF EMBODIMENTS (Configuration of Component Mounting Machine)

Figure 1:
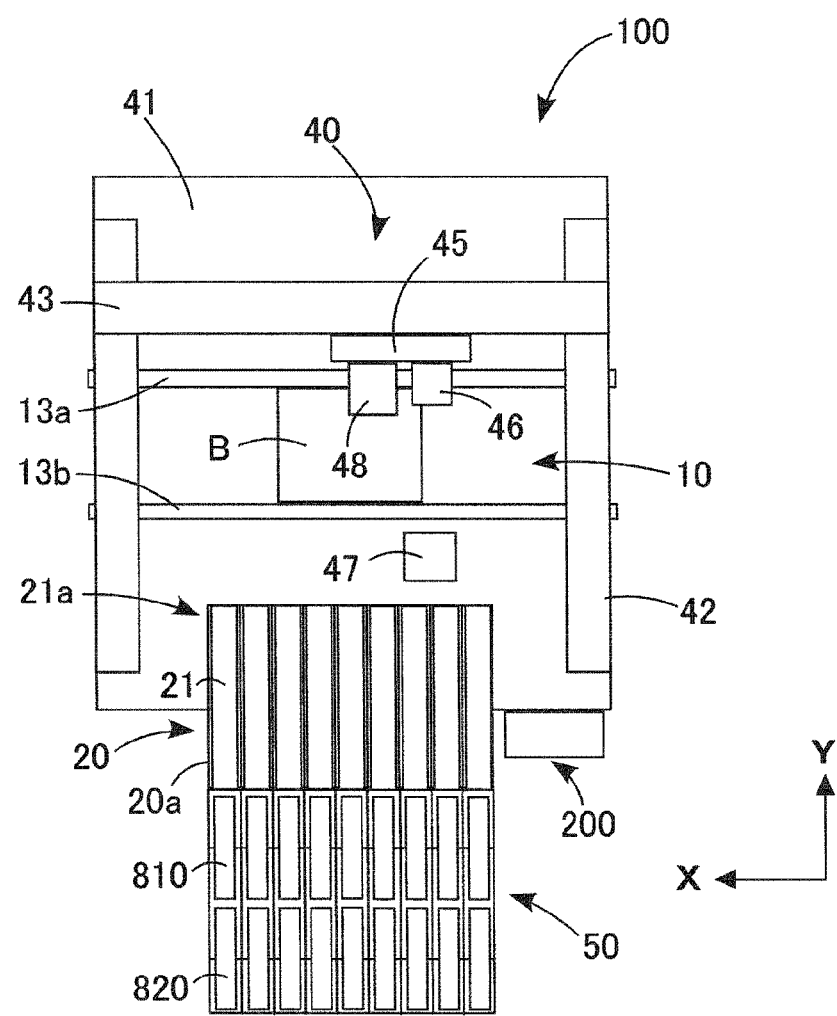
FIG. 1 is an overall plan view of a component mounting machine which is favorable to an embodiment of the present disclosure.

Hereinafter, a description will be given of an embodiment of the present disclosure with reference to the drawings. FIG. 1 illustrates a component mounting machine 100 which is provided with feeders 21 and the component mounting machine 100 includes a board conveyance section 10, a component supply section 20, a component mounting section 40, a reel holding section 50, and a control device 200 which controls these. In the following description, a conveyance direction of the board will be referred to as an X-axis direction and a horizontal direction at a right angle to the X-axis direction will be referred to as a Y-axis direction.

As illustrated in FIG. 1, the component supply section 20 is configured by multiple slots 20a and the multiple feeders 21 which are mounted to each of the slots 20a in a detachable manner. The slots 20a are provided in the component supply section 20 such that multiple slots 20a are adjacent to each other in the X-axis direction. The reel holding section 50 holds, in an exchangeable manner, first reels 810 and second reels 820 on which carrier tapes 900 (refer to FIG. 2) are wound. The first reels 810 and the second reels 820 are arranged adjacent to each other in the Y-direction and multiple reels are arranged in the X-direction corresponding to each of the feeders 21.

Although a detailed description will be given later, the carrier tapes 900 which are wound on the first reels 810 and the second reels 820 can be inserted into the corresponding feeders 21. The carrier tape 900 which is wound on one of the reels 810 (820) is sequentially conveyed to a component pickup position 21a which is provided on a tip portion of the feeder 21 by the feeder 21. Accordingly, the component which is held in the carrier tape 900 is positioned at the component pickup position 21a. The carrier tape 900 which is wound on the other reel 820 (810) is on standby without being supplied by the feeder 21.

Hereinafter, to facilitate the description, in order to distinguish between the carrier tape 900 during the conveying (during usage) and the carrier tape 900 which is standing by, there are cases in which the prior will be referred to as a first carrier tape 900A and the latter will be referred to as a second carrier tape 900B. in these cases, since the second carrier tape becomes the first carrier tape after all of the components which are stored in the first carrier tape are used, the terms the first carrier tape and the second carrier tape do not indicate a specific carrier tape.

Figure 2:
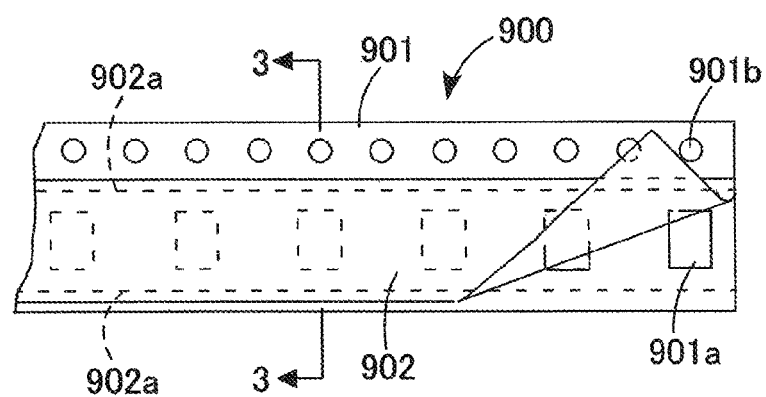
FIG. 2 is a top view of a carrier tape.
Figure 3:
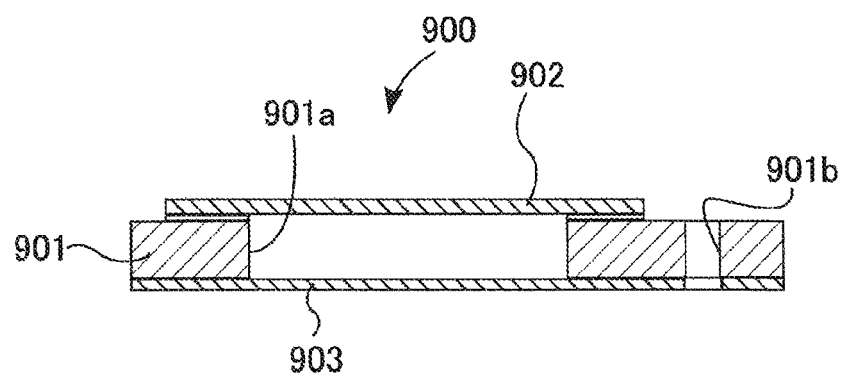
FIG. 3 is a sectional view of the carrier tape illustrated in FIG. 2 taken along a line 3-3.

As illustrated in FIGS. 2 and 3, multiple components such as electronic components are stored in a row in the carrier tape 900. The carrier tape 900 is configured by a base tape 901, a cover tape 902, and a bottom tape 903. The base tape 901 is configured by a flexible material such as a paper material or a resin. Storage sections 901a which are cavities at a fixed interval in the length direction are formed as through-holes in the center portion of the base tape 901 in the width direction. The components are stored in the storage sections 901a. Engagement holes 901b are formed as through-holes at a fixed interval in the long direction in the side portion of the base tape 901.

As illustrated in FIG. 2, both side portions of the cover tape 902 adhere to both side portions of the upper face of the base tape 901 using an adhesive 902a, and ordinarily, the cover tape 902 seals the top portion of the storage sections 901a. The components which are stored in the storage sections 901a are prevented from jumping out by the cover tape 902. The cover tape 902 is configured by a transparent polymer film. As illustrated in FIG. 3, the bottom tape 903 adheres to the lower face of the base tape 901. The components which are stored in the storage sections 901a are prevented from falling out by the bottom tape 903. The bottom tape 903 is configured by a transparent or semi-transparent paper material, a polymer film, or the like.

As illustrated in FIG. 1, in the board conveyance section 10, a pair of guide rails 13a and 13b is provided on a base 41 of the component mounting section 40. Conveyor belts (not illustrated) which support and convey a board B which is guided by both of the guide rails 13a and 13b, and clamping devices (not illustrated) which hold up and clamp the board B which is conveyed to a predetermined position are provided in the board conveyance section 10. The board B on which the components are to be mounted is conveyed in the X-axis direction to a component mounting position by the conveyor belts while being guided by the guide rails 13a and 13b of the board conveyance section 10. The board B which is conveyed to the component mounting position is positioned and clamped at the component mounting position by the clamping devices.

The component mounting section 40 includes a guide rail 42, a Y-axis slide 43, an X-axis slide 45, and a component mounting head 48 which holds a suction nozzle (not illustrated). The movement of the Y-axis slide 43 and the X-axis slide 45 in the Y-axis direction and the X-axis direction is controlled by a Y-axis servomotor and an X-axis servomotor (not illustrated). A Y-axis robot is configured by the guide rail 42 and the Y-axis slide 43. The guide rail 42 mounted above the base 41 in the Y-axis direction and is arranged to be above the board conveyance section 10. The Y-axis slide 43 is provided to be capable of moving in the Y-axis direction along the guide rail 42. The Y-axis slide 43 is caused to move in the Y-axis direction via a ball screw mechanism by the Y-axis servomotor (not illustrated).

An X-axis robot is configured by the X-axis slide 45. The X-axis slide 45 is provided to be capable of moving in the X-axis direction on the Y-axis slide 43. The X-axis servomotor (not illustrated) is provided on the Y-axis slide 43. The X-axis slide 45 is caused to move in the X-axis direction via a ball screw mechanism by the X-axis servomotor. The component mounting head 48 is provided on the X-axis slide 45. The component mounting head 48 holds multiple the suction nozzles (not illustrated) in a detachable manner. The suction nozzle sucks the component which is conveyed to the component pickup position 21a and mounts the component on the board B which is positioned at the component mounting position by the board conveyance section 10.

A board camera 46 is attached to the top of the X-axis slide 45. The board camera 46 images fiducial marks which are provided on the board B which is positioned at the board mounting position or a component or the like which is conveyed to the component pickup position 21a from above and acquires board position reference information, component positional information, and the like. A component camera 47 capable of imaging the component which is sucked by the suction nozzle from beneath is provided on the base 41.

The control device 200 controls the feeder 21 and controls the rotation of a first servomotor 22 and a second servomotor 23 (described later) of the feeder 21. The control device 200 includes a microprocessor and a driver which supplies the drive currents to the servomotors 22 and 23. When the feeder 21 is mounted in the slot 20a of the component supply section 20, power is supplied to the feeder 21 side from the main body side of the component mounting machine 100 via a communication connector (not illustrated), and necessary information such as the feeder ID is transmitted from the feeder 21 side to the control device 200 of the component mounting machine 100. Accordingly, the information of the component which is fed by the carrier tape 900 which is loaded in the feeder 21 is acquired based on the serial ID of the feeder 21 and stored in the control device 200.

(Configuration of Feeder)

Figure 4:
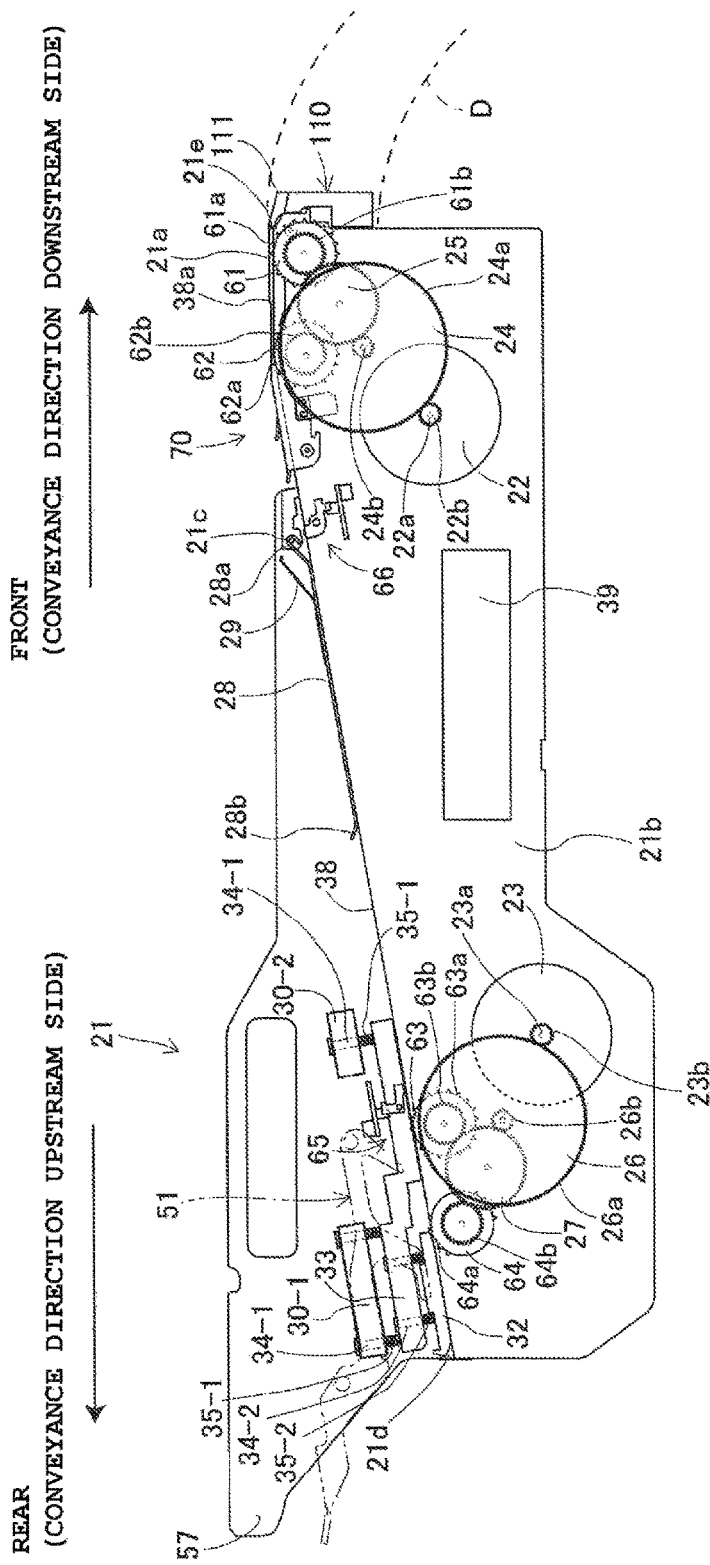
FIG. 4 is an exploded side view of a feeder illustrating an embodiment of the present disclosure.

Next, a description will be given of the configuration of the feeder 21 using FIGS. 4 to 8. As illustrated in FIG. 4, the feeder 21 is mainly configured by a feeder main body 21b, a tape conveyance path, a first sprocket 61 and a second sprocket 62 which serve as a front side sprocket, a third sprocket 63 and a fourth sprocket 64 which serve as a rear side sprocket, a tape peeling device 70 which includes a peeling member 71 and a contacting and positioning member 72 illustrated in FIG. 5, a discharge guide member 110, and the like. In FIG. 4 and FIG. 8, the side walls of the feeder main body 21b are removed such that it is possible to visually recognize the internal structure of the feeder 21.

As illustrated in FIG. 4, the feeder main body 21b is a flat box shape. A tape insertion section 21d for inserting the carrier tape 900 is formed at the rear portion of the feeder main body 21b and a tape discharging section 21e for discharging the carrier tape 900 is formed at the front portion of the feeder main body 21b. The tape insertion section 21d is formed as an entrance of the tape conveyance path 38 which has the same width as the width of the tape conveyance path 38, and the tape discharging section 21e is formed as an exit of the tape conveyance path 38 which has the same width as the width of the tape conveyance path 33.

The tape conveyance path 38 is provided in the feeder main body 21b so as to communicate the tape insertion section 21d and the tape discharging section 21e in order to convey the carrier tape 900 from the rear of the feeder main body 21b toward the front. A front portion 38a of the tape conveyance path 38 is formed horizontally. In the present embodiment, the tape conveyance path 38 is inclined to gradually increase in height from the rear portion to in front of the front portion 38a. Although not illustrated, guide sections which are separated by a dimension which is slightly greater than a width dimension of the carrier tape 900 are provided on both sides of the tape conveyance path 38.

An inlet pressing member 32 retains the carrier tape 900 which is inserted from the tape insertion section 21d toward the tape conveyance path 38, is disposed along the upper face of the rear portion of the tape conveyance path 38 in the proximity of the tape insertion section 21d, and is provided to be capable of separating from and approaching the tape conveyance path 38. The inlet pressing member 32 is attached beneath the rear portion of a downstream side pressing member 33 via a pair of shafts 34-2 to be capable of moving in the up-down direction. Springs 35-2 which bias the inlet pressing member 32 downward are attached to the pair of shafts 34-2.

The downstream side pressing member 33 retains the carrier tape 900 at the downstream side of the inlet pressing member 32 and is provided to be capable of separating from and approaching the tape conveyance path 38. The downstream side pressing member 33 is attached to a first support member 30-1 and a second support member 30-2, which are attached to the feeder main body 21b, via shafts 34-1 so as to be capable of moving in the up-down direction. Springs 35-1 which bias the downstream side pressing member 33 downward are attached to the shafts 34-1.

The first sprocket 61 and the second sprocket 62 are provided, to be capable of rotating, from the front toward the rear (from the downstream side to the upstream side in the conveyance direction) on the feeder main body 21b beneath the front portion 38a of the tape conveyance path 38, that is, at positions adjacent to the component pickup position 21a of the feeder main body 21b. The third sprocket 63 and the fourth sprocket 64 are provided, to be capable of rotating, from the front toward the rear on the feeder main body 21b beneath the rear portion of the tape conveyance path 38.

Engagement protrusions 61a, 62a, and 63a are formed at a fixed angle along the entire circumferences on the outer circumferences of the first sprocket 61, the second sprocket 62, and the third sprocket 63, respectively. Engagement protrusions 64a are provided on portion of the outer circumference of the fourth sprocket 64 at a 180° interval. In other words, portions in which engagement protrusions are not formed are present between each of the engagement protrusions 64a of the fourth sprocket 64. The engagement protrusions 61a to 64a are capable of engaging with the engagement holes 901b of the carrier tape 900.

A first sprocket gear 61b, a second sprocket gear 62b, a third sprocket gear 63b, and a fourth sprocket gear 64b are formed closer to the inside than the outer circumferential portions of the first sprocket 61 to the fourth sprocket 64, respectively. Window holes (not illustrated) are provided in the tape conveyance path 38 above each of the sprockets 61 to 64 and the engagement protrusions 61a to 64a enter the tape conveyance path 38 from the window holes.

The first servomotor 22 is a motor which causes the first sprocket 61 and the second sprocket 62 to rotate. A first drive gear 22b is provided on a rotating shaft 22a of the first servomotor 22. A first gear 24 is provided on the feeder main body 21b beneath the first sprocket 61 and the second sprocket 62 to be capable of rotating. A first outer gear 24a which meshes with the first drive gear 22b is formed on the outer circumference of the first gear 24. A first inner gear 24b is formed closer to the inside than the outer circumference of the first gear 24.

A second gear 25 is provided on the feeder main body 21b between the first sprocket 61 and the second sprocket 62, and the first gear 24 to be capable of rotating. The second gear 25 meshes with the first sprocket gear 61b, the second sprocket gear 62b, and the first inner gear 24b. According to this configuration, the rotation of the first servomotor 22 is decelerated and transmitted to the first sprocket 61 and the second sprocket 62, and, the first sprocket 61 and the second sprocket 62 rotate in synchronization.

The second servomotor 23 is a motor which causes the third sprocket 63 and the fourth sprocket 64 to rotate. A second drive gear 23b is provided on a rotating shaft 23a of the second servomotor 23. A third gear 26 is provided on the feeder main body 21b beneath the third sprocket 63 and the fourth sprocket 64 to be capable of rotating. A third outer gear 26a which meshes with the second drive gear 23b is formed on the outer circumference of the third gear 26. A third inner gear 26b is formed closer to the inside than the outer circumference of the third gear 26.

A fourth gear 27 is provided on the feeder main body 21b between the third sprocket 63 and the fourth sprocket 64, and the third gear 26 to be capable of rotating. The fourth gear 27 meshes with the third sprocket gear 63b, the fourth sprocket gear 64b, and the third inner gear 26b. According to this configuration, the rotation of the second servomotor 23 is decelerated and transmitted to the third sprocket 63 and the fourth sprocket 64, and, the third sprocket 63 and the fourth sprocket 64 rotate in synchronization.

As illustrated in FIG. 8, an operation lever 51 is provided to protrude above and to the rear of the tape insertion section 21d of the rear portion of the feeder main body 21b and is supported to be capable of rotational movement centered on a pivot 52. A lever operation gripping section 57 (also refer to FIG. 4) is formed above the operation lever 51 to protrude to the rear from the rear portion of the feeder main body 21b. The operation lever 51 is provided such that the pivot 52 side is stored in the lever operation gripping section 57 and an operation knob 51b side protrudes from the lever operation gripping section 57 such that an operator can easily grip the lever operation gripping section 57 with a palm and operate the operation knob 51b with fingers.

As described later, the inlet pressing member 32 is functionally connected to the operation lever 51. An engagement member 54 is provided on the inlet pressing member 32 between the pair of shafts 34-2. An operation engaging section 51a which engages with a lower face of the engagement member 54 of the inlet pressing member 32 is formed on the center portion of the operation lever 51. The operation lever 51 is rotationally moved counter-clockwise in FIG. 8 by the biasing force of a spring 55 and, ordinarily, holds the operation engaging section 51a at a lowered position and causes the inlet pressing member 32 to contact the tape conveyance path 38 using the biasing force of the springs 35-2. Accordingly, ordinarily, it is not possible to insert the carrier tape 900 by the tape insertion section 21d due to the inlet pressing member 32.

In contrast, when the operation knob 51b which is provided on the rear end of the operation lever 51 is lifted up by the operator and the operation lever 51 is rotationally moved against the biasing force of the spring 55, the inlet pressing member 32 is lifted against the biasing force of the springs 35-2 via the operation engaging section 51a. Accordingly, the inlet pressing member 32 is caused to separate upward from the tape conveyance path 38 and it becomes possible to insert the carrier tape 900 from the tape insertion section 21d.

Figure 9:
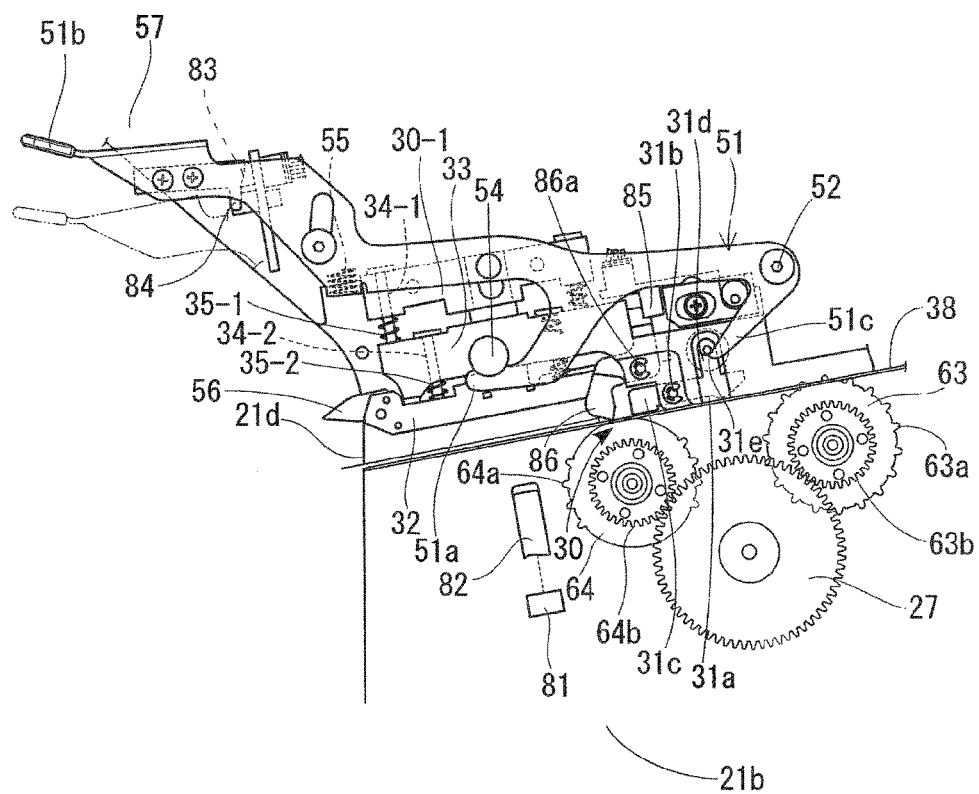
FIG. 9 is an operational state view of FIG. 8 illustrating a state in which an operation lever of the feeder is lifted up and the carrier tape is inserted.

A baffle plate 56 which blocks the tape insertion section 21d is pivotally supported on the rear portion of the inlet pressing member 32. The baffle plate 56 ensures that it is not possible to insert the carrier tape 900 between the tape conveyance path 38 and the inlet pressing member 32. As illustrated in FIG. 9, when the inlet pressing member 32 is lifted, the baffle plate 56 engages with the rear portion of the downstream side pressing member 33 and rotationally moves to open the tape insertion section 21d.

A stopper member 30 is provided adjacent to the inlet pressing member 32 on the downstream side of the inlet pressing member 32. The stopper member 30 is capable of rotationally moving due to a shaft support section 31b, which is formed in a center portion of the stopper member 30, being axially supported by the downstream side pressing member 33. An abutting section 31a which is formed to protrude downward is formed on the bottom portion of the stopper member 30 which is closer to the front than the shaft support section 31b. The rear end of the stopper member 30 is a stopping section 31c.

A spring (not illustrated) which biases the abutting section 31a in a direction in which the abutting section 31a contacts the tape conveyance path 38 is provided between the downstream side pressing member 33 and the stopper member 30. A protruding section 31d which protrudes upward is formed on the top portion of the stopper member 30 which is closer to the front than the shaft support section 31b and a cam follower 31e is provided on the distal end of the protruding portion 31d. A cam section 51c which is formed on the front portion of the operation lever 51 is engaged with the cam follower 31e to be capable of engaging and disengaging therewith.

In a state in which the operation lever 51 is rotational moved counter-clockwise of FIG. 8 by the biasing force of the spring 55 and the inlet pressing member 32 is held at a position in contact with the tape conveyance path 38, the cam section 51c which is formed on the operation lever 51 separates from the cam follower 31e of the stopper member 30. Accordingly, the stopper member 30 is rotationally moved clockwise of FIG. 8 centered on the shaft support section 31b by the biasing force of the spring (not illustrated), the abutting section 31a is caused to contact the tape conveyance path 38, and the stopping section 31c is held at a position which is separated from the tape conveyance path 38.

Meanwhile, when the operation lever 51 is rotationally moved against the biasing force of the spring 55, the cam section 51c which is formed on the operation lever 51 engages with the cam follower 31e of the stopper member 30 to cause the stopper member 30 to rotationally move counter-clockwise of FIG. 8 against the biasing force of the spring (not illustrated) and the stopping section 31c contacts the tape conveyance path 38. Accordingly, when the first carrier tape 900A is inserted from the tape insertion section 21d in a state in which the operation lever 51 is rotationally moved against the biasing force of the spring 55, the leading end of the first carrier tape 900A contacts the stopping section 31c of the stopper member 30 and is stopped at a predetermined position.

When the first carrier tape 900A passes between the abutting section 31a and the tape conveyance path 38 of the stopper member 30, the abutting section 31a is lifted up by the first carrier tape 900A and the stopping section 31c of the stopper member 30 contacts the tape conveyance path 38.

Therefore, in this state, when the second carrier tape 900B is inserted over the first carrier tape 900A from the tape insertion section 21d by the operator, the leading end of the second carrier tape 900B contacts the stopping section 31c of the stopper member 30 and stops. Accordingly, the conveyance of the second carrier tape 900B downstream is prevented and the second carrier tape 900B waits at that position.

A first sensor 81 which detects the insertion of the first carrier tape 900A when the first carrier tape 900A is inserted from the tape insertion section 21d is attached to the feeder main body 21b. In the first sensor 81, due to a first dog 82 which protrudes from an upper face of the tape conveyance path 38 being lowered by the insertion of the first carrier tape 900A, the first sensor 81 is turned on. The first dog 82 is held at a position which protrudes from the upper face of the tape conveyance path 38 by the biasing force of a spring (not illustrated) and is pressed downward when the first carrier tape 900 is inserted.

A second sensor 83 which detects that the operation lever 51 is rotationally moved and a third sensor 85 which is activated when the second carrier tape 900B is conveyed to the tape conveyance path 38 above the fourth sprocket 64 are attached to the feeder main body 21b. The second sensor 83 is turned on by a second dog 84 which is attached to the operation lever 51. The third sensor 85 is turned on by the rotational movement of a third dog 86.

The third dog 86 is capable of rotationally moving due to a shaft support section 86a, which is formed in a center portion of the third dog 86, being axially supported by the downstream side pressing member 33. The third dog 86 is biased counter-clockwise of FIG. 8 by an ordinary spring (not illustrated). Accordingly, when the carrier tape 900 is not present in the tape conveyance path 38, the distal end of the third dog 86 is in contact with the upper face of the tape conveyance path 38, and when the first carrier tape 900A is present in the tape conveyance path 38, the distal end of the third dog 86 is in contact with the upper face on the first carrier tape 900A.

As illustrated in FIG. 4, a fourth sensor 65 which detects the presence of the carrier tape 900 and outputs the detection signal to a control section 39 is provided on the feeder main body 21b of the downstream side (the rear end portion side of the feeder 21) of the third sprocket 63. The fourth sensor 65 is a sensor which detects a boundary portion between the first carrier tape 900A and the second carrier tape 900B. A fifth sensor 66 which detects the presence of the carrier tape 900 and outputs the detection signal to the control section 39 is provided on the feeder main body 21b of the upstream side (the front end portion side of the feeder 21) of the second sprocket 62.

A lifting prevention member 28 is provided along the top of the tape conveyance path 38 between the third sprocket 63 and the second sprocket 62. A shaft support section 28a is formed on the front end of the lifting prevention member 28, the shaft support section 28a is axially supported on a shaft section 21c which is provided on the feeder main body 21b, and the lifting prevention member 28 is attached to the feeder main body 21b to be capable of rocking. A guide section 28b which is bent upward is formed on the rear end of the lifting prevention member 28. A torsion spring 29 is attached to the feeder main body 21b above the lifting prevention member 28 and biases the lifting prevention member 28 downward. The lower face of the lifting prevention member 28 is caused to come into close contact with the upper face of the tape conveyance path 38 by the torsion spring 29.

Figure 5:
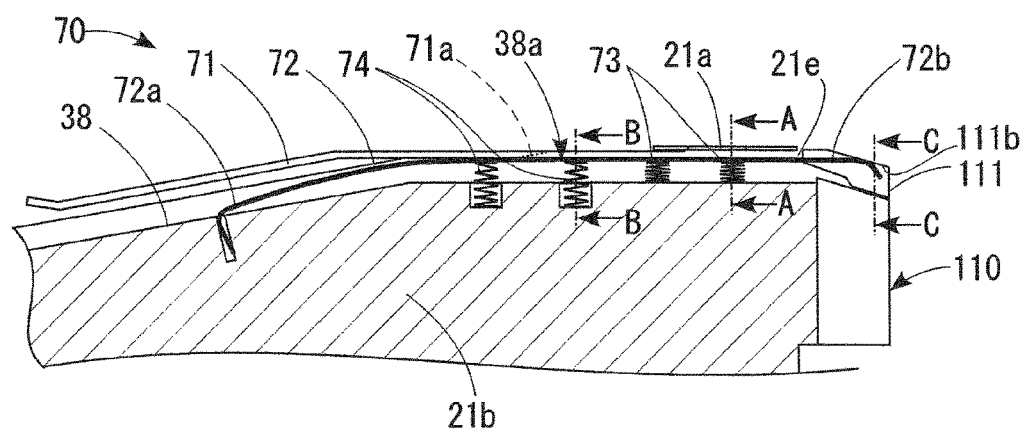
FIG. 5 is a partial sectional side view illustrating a peeling member, a contacting and positioning member, and a discharge guide member which are provided on a front portion side of the feeder.

As illustrated in FIG. 5, the tape peeling device 70 is provided with the peeling member 71, the contacting and positioning member 72, a pair of front springs 73, and a pair of rear springs 74. The peeling member 71 is provided to cover the front portion 38a of the tape conveyance path 38 at the top portion of the front side of the feeder main body 21b. The contacting and positioning member 72 is formed in a belt plate shape and is disposed between the peeling member 71 and the front portion 38a of the tape conveyance path 38.

Figure 6:
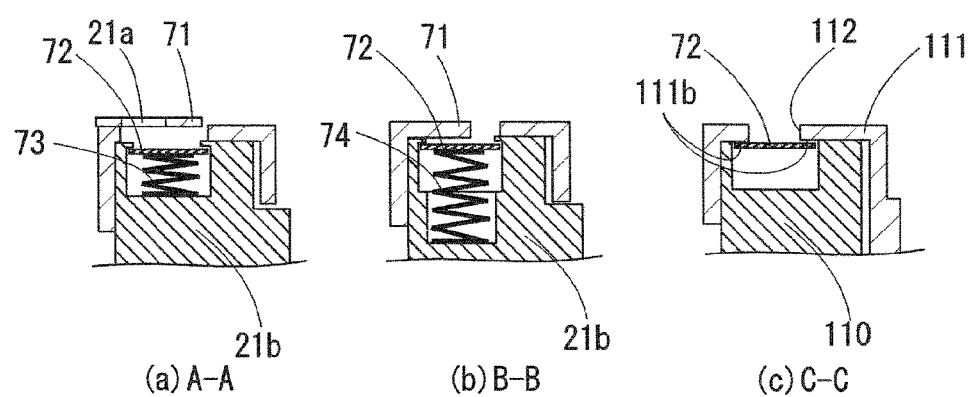
FIGS. 6 (*a*), (*b*), and (*c*) are an A-A line sectional view, a B-B line sectional view, and a C-C line sectional view of the peeling member illustrated in FIG. 5.

As illustrated in FIG. 5 and FIG. 6 (a), the pair of front springs 73 is disposed between the contacting and positioning member 72 and the front portion 38a of the tape conveyance path 38 in the vicinity of the component pickup position 21a. As illustrated in FIG. 5 and FIG. 6 (b), the pair of rear springs 74 is disposed between the contacting and positioning member 72 and the front portion 38a of the tape conveyance path 38 closer to the conveyance upstream side than the pair of front springs 73 in the vicinity of a peeling blade 71a of the peeling member 71.

As illustrated in FIG. 5, the peeling member 71 includes the peeling blade 71a which is inclined from the conveyance upstream side to rise toward the conveyance downstream side at the position at which the pair of rear springs 74 is disposed. The peeling member 71 separates the cover tape 902 from the carrier tape 900 using the peeling blade 71a and ensures that it is possible to pick up a component from the storage section 901a which is positioned at the component pickup position 21a.

The contacting and positioning member 72 is formed such that an upstream side end portion 72a of the tape conveyance upstream side is locked inside a groove which is provided in the tape conveyance path 38 and a downstream side end portion 72b of the tape conveyance downstream side extends more to the front than the tape discharging section 21e to enter the discharge guide member 110. In other words, as illustrated in FIG. 6 (b), due to the biasing force of the pair of rear springs 74, the contacting and positioning member 72 pushes up the lower face of the carrier tape 900 by a tape conveyance upstream side portion using the upstream side end portion 72a as a fulcrum and is formed to allow the cover tape 902 to contact the peeling member 71. As illustrated in FIG. 6 (a) and (c), due to the biasing force of the pair of front springs 73, the contacting and positioning member 72 pushes up the lower face of the carrier tape 900 by the downstream side end portion 72b and pushes the upper face of the carrier tape 900 onto the discharge guide member 110, and thus, is formed to be capable of positioning at a regular position inside the discharge guide member 110.

The elastic force of the rear springs 74 is set to a value which is greater than the elastic force of the front springs 73. This is because it is necessary for the rear springs 74 to cause the cover tape 902 to reliably contact the peeling member 71 and the front springs 73 only position the carrier tape 900 at a regular position inside the discharge guide member 110.

As illustrated in FIG. 4, since the discharge guide member 110 guides such the carrier tape 900 which is discharged from the tape discharging section 21e heads downward inside a discharge duct D, the discharge guide member 110 is provided on the front portion of the feeder main body 21b. When the carrier tape 900 is passing the tape conveyance path 38, the movement in directions other than the conveyance direction is restricted; however, when the carrier tape 900 is discharged from the tape discharging section 21e, the carrier tape 900 is also capable of moving in directions other than the conveyance direction.

Accordingly, the carrier tape 900 may jump upward from the tape discharging section 21e and be discharged, and there are cases in which this poorly influences the component mounting. Therefore, the discharge guide member 110 which includes a tape retaining section 111 which retains and guides the carrier tape 900 such that the carrier tape 900 is forced to head downward when the carrier tape 900 is discharged from the tape discharging section 21e is provided on the front portion of the feeder main body 21b.

Figure 7:
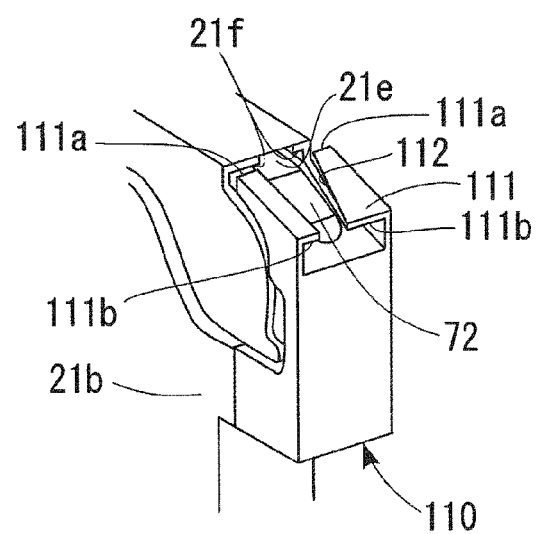
FIG. 7 is a perspective view of a discharge guide member illustrated in FIG. 5.
Figure 8:
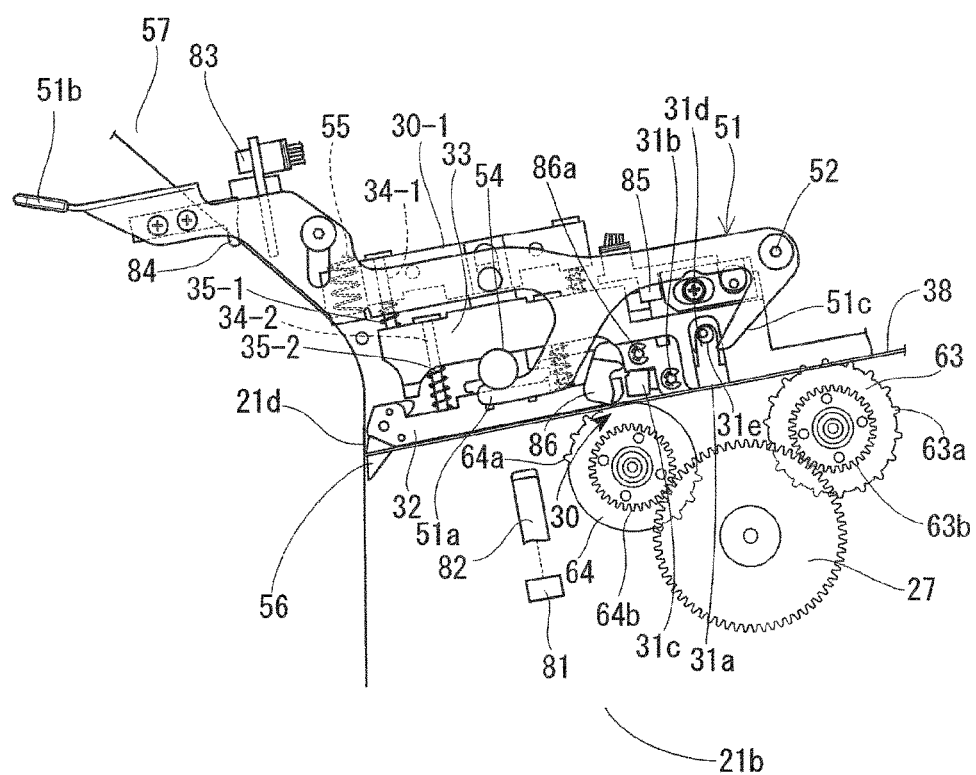
FIG. 8 is a detailed view in which the periphery of a rear side sprocket and the like which is provided on the rear portion side of the feeder is enlarged.

As illustrated in FIG. 7, a slit 112 is provided in the tape retaining section 111 of the discharge guide member 110 in the discharge direction of the carrier tape 900 in order to prevent the stacking of components. The tape retaining section 111 functions as a guide and a jump-out prevention of the carrier tape 900 which is discharged. The tape retaining section III is formed such that, when the leading end of the carrier tape 900 is discharged from the tape discharging section 21e, the leading end of the carrier tape 900 heads downward along a ceiling guide surface 111b of the tape retaining section 111 without touching an end portion 111a of the tape retaining section 111 of the tape discharging section 21e side. In other words, the tape retaining section 111 is formed such that the ceiling guide surface 111b starts at the same height as a ceiling surface 21f of the tape discharging section 21e and heads gradually diagonally downward toward the front.

When the usage of the first carrier tape 900A is completed, the first carrier tape 900A separates from the first sprocket 61 and the tail end of the first carrier tape 900A is discharged from the tape discharging section 21e. At this time, if the first carrier tape 900A remains inside the discharge guide member 110 in the discharged state, the leading end of the second carrier tape 900B contacts the tail end of the first carrier tape 900A and is capable of pushing the first carrier tape 900A out into the discharge duct D.

However, since the inside of the discharge guide member 110 is formed to be a hollow shape corresponding to various component sizes, there is a case in which the first carrier tape 900A which is discharged is subjected to positional deviation downward inside the discharge guide member 110. In this case, since the leading end of the second carrier tape 900B is not able to contact the tail end of the first carrier tape 900A, the first carrier tape 900A may no longer be pushed out into the discharge duct D. When this state continues, the carrier tapes 900 which are not discharged overlap each other and remain inside the discharge guide member 110 and there is a concern that the carrier tape 900 which is in use will jam.

Therefore, the downstream side end portion 72b of the contacting and positioning member 72 extends further to the front than the tape discharging section 21e and enters the discharge guide member 110 and positions the carrier tape 900 which is discharged from the tape discharging section 21e at a regular position inside the discharge guide member 110, that is, positions the carrier tape 900 which is discharged at a position at which the leading end of the carrier tape 900 which is in use is able to contact the tail end of the carrier tape 900 which is discharged. In other words, the downstream side end portion 72b of the contacting and positioning member 72 pushes the carrier tape 900 onto the ceiling guide surface 111b of the tape retaining section 111 of the discharge guide member 110 using the biasing force of the pair of front springs 73.

(Operations of Feeder)

Next, a description will be given of the operations of the feeder 21 according to the embodiment with reference to FIGS. 8 to 10, FIGS. 11A, B to 13A, B, and FIGS. 14A to F. Here, the first carrier tape 900A is wound onto the reel 810 of the front side and the second carrier tape 900B is wound onto the reel 820 of the rear side. Ordinarily, the operation lever 51 is held in the state illustrated in FIG. 8 by the biasing force of the spring 55, the inlet pressing member 32 is caused to contact the tape conveyance path 38, and the baffle plate 56 is caused to rotationally move by its own weight to block the tape insertion section 21d.

In this state, as illustrated in FIG. 9, the operation knob 51b of the operation lever 51 is lifted up and operated by the operator. When the operation lever 51 is lifted up and operated, the second sensor 83 is operated by the second dog 84 and the operation of the operation lever 51 is detected. According to the rotational movement of the operation lever 51, the inlet pressing member 32 is lifted via the operation engaging section 51a.

Accordingly, the inlet pressing member 32 is separated from the tape conveyance path 38 and the baffle plate 56 is caused to rotationally move by the downstream side pressing member 33. As a result, the tape insertion section 21d is opened and the insertion of the carrier tape 900 becomes possible. At the same time, due to the rotational movement of the operation lever 51, the stopper member 30 is rotationally moved by the cam section 51c and the stopping section 31c contacts the tape conveyance path 38.

In this state, the leading end of the first carrier tape 900A is inserted along the tape insertion section 21d onto the tape conveyance path 38 by the operator. The first carrier tape 900A is inserted to a predetermined position at which the tape leading end contacts the stopping section 31c of the stopper member 30. Accordingly, since the first dog 82 and the third dog 86 are operated by the first carrier tape 900A, the first sensor 81 and the third sensor 85 are operated and the first carrier tape 900A being inserted to a predetermined position is detected.

When the first carrier tape 900A is inserted to a position at which the first carrier tape 900A contacts the stopping section 31c, the operation of the operation lever 51 is removed and the operation lever 51 rotationally moves to return to the original position illustrated by a double-dot chain line of FIG. 9 by the biasing force of the spring 55. According to the rotational movement and returning of the operation lever 51, the inlet pressing member 32 is lowered toward the tape conveyance path 38 and the first carrier tape 900A which is inserted is retained toward the tape conveyance path 38.

Figure 10:
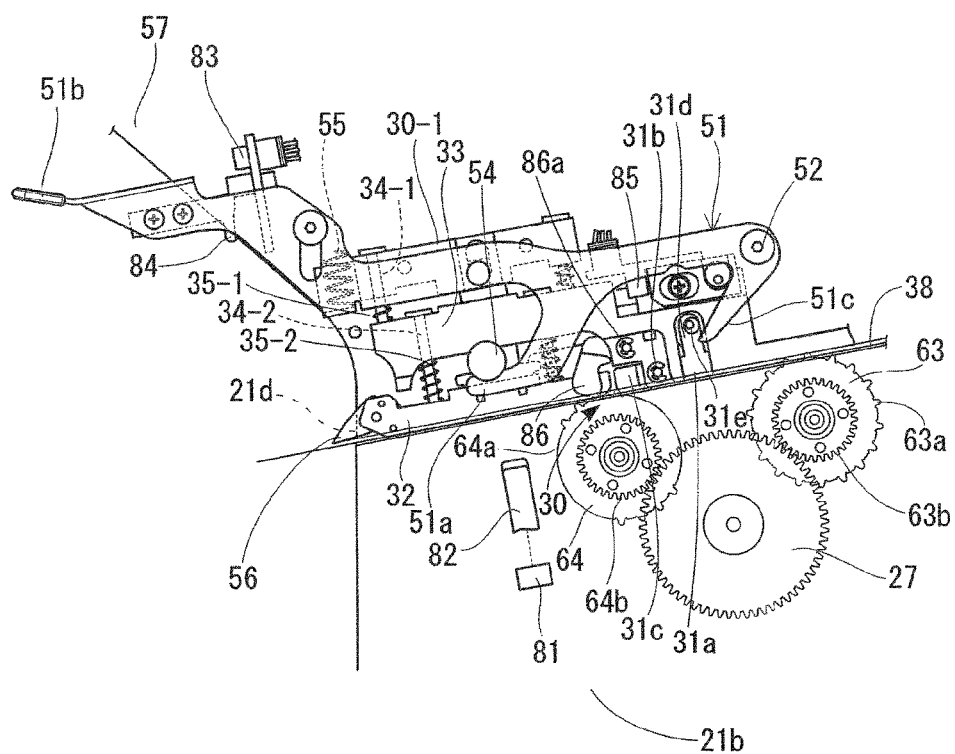
FIG. 10 is an operational state view of FIG. 8 illustrating a conveyance state of the carrier tape after the operation lever of the feeder is returned to an original position.

As illustrated in FIG. 10, when the insertion of the first carrier tape 900A is detected and the rotational movement and returning of the operation lever 51 to the original position is detected (the second sensor 83 is off), the second servomotor 23 is driven and the third and fourth sprockets 63 and 64 are rotated. Accordingly, the engagement protrusions 64a of the fourth sprocket 64 engage with the engagement holes 901b of the first carrier tape 900A and the first carrier tape 900A is conveyed to the third sprocket 63 side by the fourth sprocket 64.

According to the conveyance of the first carrier tape 900A by the fourth sprocket 64, the downstream side pressing member 33 is lifted up against the biasing force of the springs 35-1 by the first carrier tape 900A and the first carrier tape 900A is conveyed between the downstream side pressing member 33 and the tape conveyance path 38.

In this case, since the engagement protrusions 64a of the fourth sprocket 64 are only formed on a portion of the outer circumference of the fourth sprocket 64, when the engagement protrusions 64a engage with the engagement holes 901b of the first carrier tape 900A, the first carrier tape 900A moves intermittently to the third sprocket 63 side. As a result, the first carrier tape 900A is not abruptly pulled to the third sprocket 63 side. When the downstream side pressing member 33 is lifted up by the first carrier tape 900A, the stopper member 30 and the shaft support sections 31b and 86a of the third dog 86 are integrally lifted.

When the engagement holes 901b which are formed in the first carrier tape 900A which is conveyed engage with the engagement protrusions 63a of the third sprocket 63 due to the fourth sprocket 64, the first carrier tape 900A is conveyed to the second sprocket 62 side due to the third sprocket 63. Since the engagement protrusions 63a are formed along the entire circumference of the outer circumference of the third sprocket 63, the first carrier tape 900A is conveyed to the second sprocket 62 side in a short time.

The leading end of the first carrier tape 900A enters under the lifting prevention member 28 from between the guide section 28b and the tape conveyance path 38. The leading end of the first carrier tape 900A is reduced from lifting up from the tape conveyance path 38 by the lifting prevention member 28 and is conveyed toward the second sprocket 62. When the fifth sensor 66 detects the leading end of the first carrier tape 900A which is conveyed by the third sprocket 63, the first servomotor 22 and the second servomotor 23 cause the sprockets 61 to 64 to intermittently rotate at the pitch interval of the components.

When the engagement holes 901b which are formed in the first carrier tape 900A engage with the engagement protrusions 62a of the second sprocket 62, the first carrier tape 900A is fed to the tape peeling device 70 by the second sprocket 62 and the cover tape 902 is peeled from the first carrier tape 900A by the tape peeling device 70.

Figure 11A:
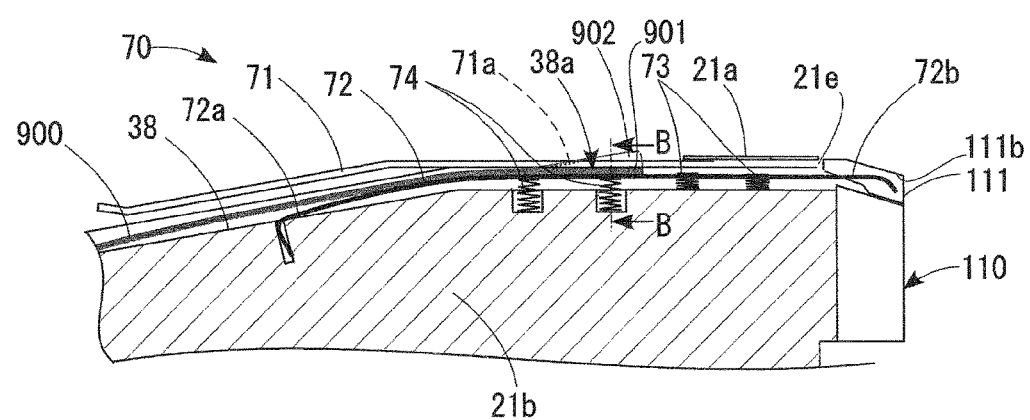
FIG. 11A is a partial sectional side view illustrating a first peeling state of the cover tape by the peeling member and the contacting and positioning member illustrated in FIG. 5.
Figure 11B:
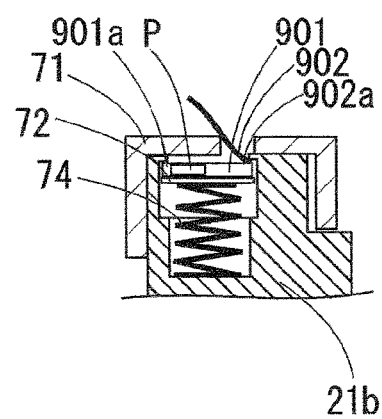
FIG. 11B is a B-B line sectional view of FIG. 11A.

In other words, the first carrier tape 900A enters between the peeling member 71 and the contacting and positioning member 72. Therefore, the peeling blade 71a of the peeling member 71 contacts the adhesive 902a of one side of the cover tape 902 which covers the base tape 901 of the first carrier tape 900A and the distal end of the peeling blade 71a enters between both of the tapes 901 and 902. As illustrated in FIGS. 11A and B, one side of the cover tape 902 is lifted up along the peeling blade 71a, which is inclined, and is peeled from the base tape 901.

Figure 12A:
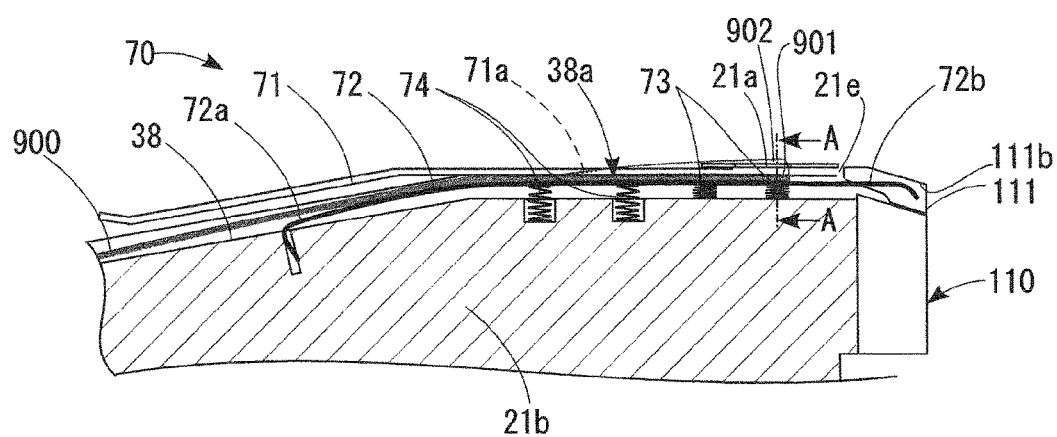
FIG. 12A is a partial sectional side view illustrating a second peeling state of the cover tape by the peeling member and the contacting and positioning member illustrated in FIG. 5.
Figure 12B:
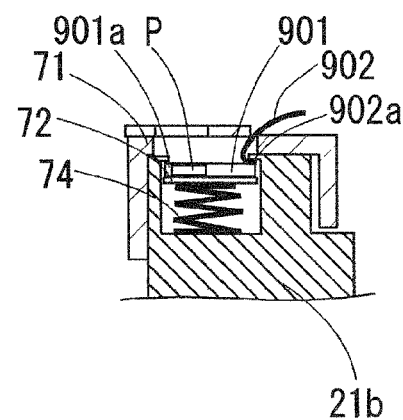
FIG. 12B is an A-A line sectional view of FIG. 12A.

When the engagement holes 901b which are formed in the first carrier tape 900A engage with the engagement protrusions 61a of the first sprocket 61, as illustrated in FIGS. 12A and B, components P which are stored in the storage sections 901a of the first carrier tape 900A are sequentially positioned at the component pickup position 21a by the first sprocket 61. At this time, the cover tape 902 one side of which is peeled off from the base tape 901 is in a state of being bent back to an opposite side from the storage sections 901a by the peeling member 71. Accordingly, since the storage sections 901a are exposed without being covered by the cover tape 902 which is peeled off, the components P are easily and reliably taken out.

Figure 13A:
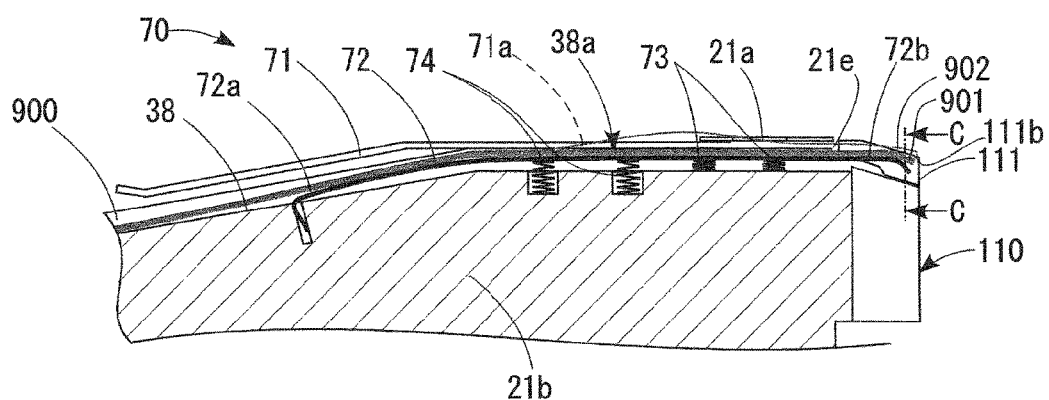
FIG. 13A is a partial sectional side view illustrating a third peeling state of the cover tape by the peeling member and the contacting and positioning member illustrated in FIG. 5.
Figure 13B:
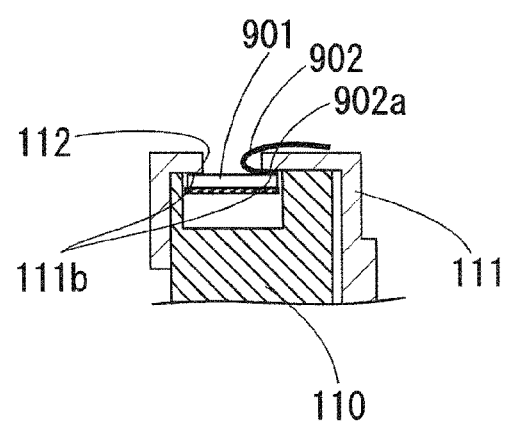
FIG. 13B is a C-C line sectional view of FIG. 13A.
Figure 14A:
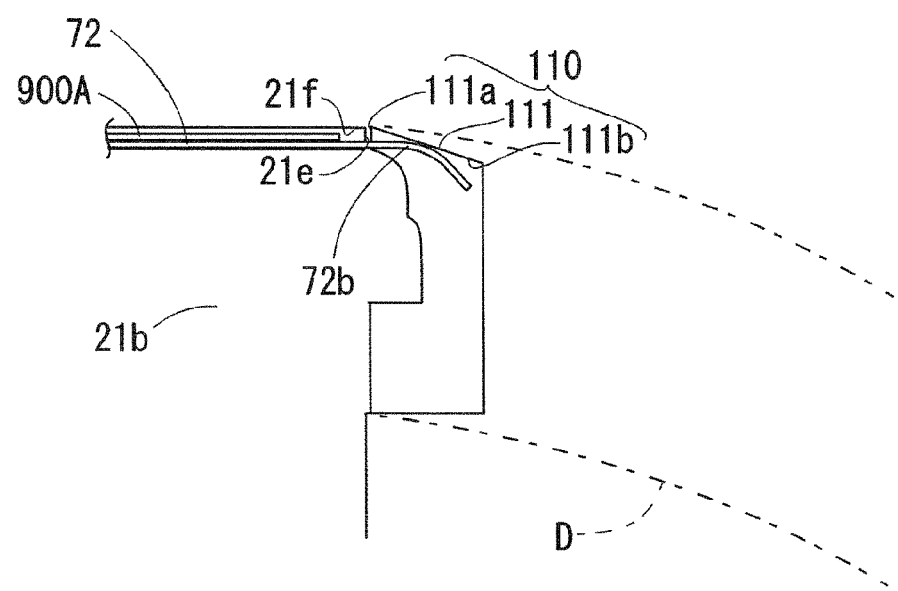
FIG. 14A is a view illustrating the contacting and positioning member and the discharge guide member when the first carrier tape is conveyed thereto.
Figure 14B:
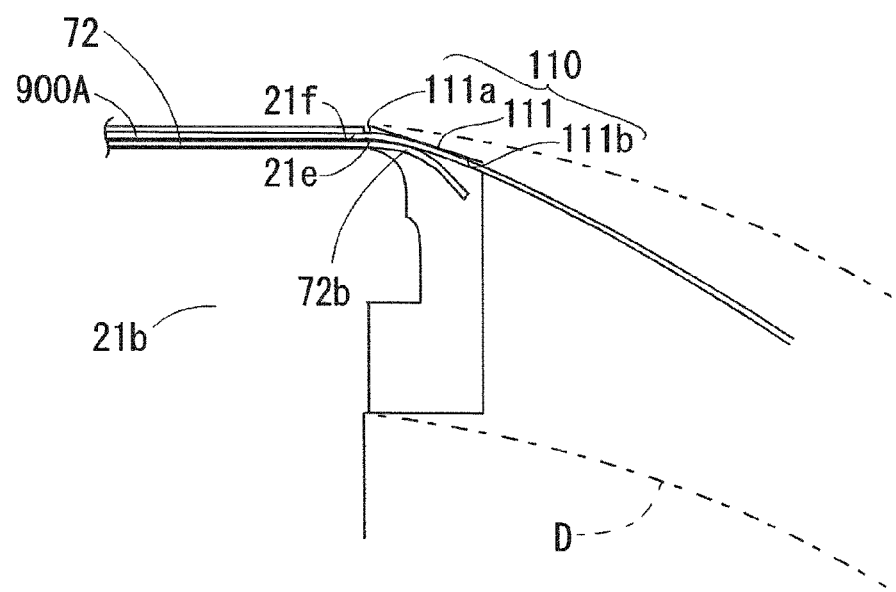
FIG. 14B is a view illustrating the contacting and positioning member and the discharge guide member when the first carrier tape is being conveyed.

As illustrated in FIGS. 14A and B, the leading end of the first carrier tape 900A is guided along the tape discharging section 21e and diagonally downward along the ceiling guide surface 111b of the tape retaining section 111 of the discharge guide member 110 and contacts a bent section 72b of the distal end of the contacting and positioning member 72. In other words, as illustrated in FIGS. 13A and B, the leading end of the first carrier tape 900A pushes down the bent section 72b against an elastic force and enters between the bent section 72b and the ceiling guide surface 111b of the tape retaining section 111.

The upper face of the first carrier tape 900A is guided by the ceiling guide surface 111b of the tape retaining section 111 and the lower face of the first carrier tape 900A is pushed up by the bent section 72b and the upper face of the first carrier tape 900A is pushed onto the ceiling guide surface 111b of the tape retaining section 111. Accordingly, the first carrier tape 900A is gradually discharged downward inside the discharge duct D while maintaining a regular position along the ceiling guide surface 111b of the tape retaining section 111.

In a case in which the first carrier tape 900A is conveyed by the feeder 21, as illustrated in FIG. 10, the first carrier tape 900A presses the abutting section 31a of the stopper member 30 and the stopper member 30 is rotationally moved against the biasing force of a spring 36. Accordingly, the stopping section 31c of the stopper member 30 touches the upper face of the first carrier tape 900A.

In this state, as described earlier, the operation lever 51 is rotationally moved and operated (the second sensor 83 is on) and the leading end of the second carrier tape 900B is inserted between the first carrier tape 900A and the inlet pressing member 32. Therefore, the leading end of the second carrier tape 900B contacts the stopping section 31c of the stopper member 30 and the second carrier tape 900B is stopped at that position.

Accordingly, the conveyance of the second carrier tape 900B downstream is prevented and the second carrier tape 900B waits at that position. When the second carrier tape 900B is inserted to the position at which the second carrier tape 900B contacts the stopping section 31c of the stopper member 30, since the third dog 86 is operated by the second carrier tape 900B, the insertion of the second carrier tape 900B is detected by the third sensor 85.

When the operation of the operation lever 51 is removed after the second carrier tape 900B is inserted, the operation lever 51 returns to the original position; however, since the abutting section 31a of the stopper member 30 is pressed by the first carrier tape 900A, the stopping state of the second carrier tape 900B is continued by the stopping section 31c of the stopper member 30. Even if the second carrier tape 900B is to be inserted from the tape insertion section 21d without rotationally moving and operating the operation lever 51, the insertion of the second carrier tape 900B is prevented by the baffle plate 56 which contacts the upper face of the first carrier tape 900A (refer to FIG. 10).

When the tail end of the first carrier tape 900A is conveyed to closer to the downstream side than the leading end of the second carrier tape 900B, the engagement holes 901b which are formed in the second carrier tape 900B engage with the engagement protrusions 64a of the fourth sprocket 64. Subsequently, the second carrier tape 900B enters the gap between the tape conveyance path 38 and the stopper member 30 which is created by the first carrier tape 900A and is conveyed toward the second sprocket 62. When the leading end of the second carrier tape 900B pushes up the abutting section 31a, as described earlier, the stopper member 30 again rotationally moves against the biasing force of the spring 36 and the entrance of the new carrier tape 900 is prevented by the stopper member 30.

Figure 14C:
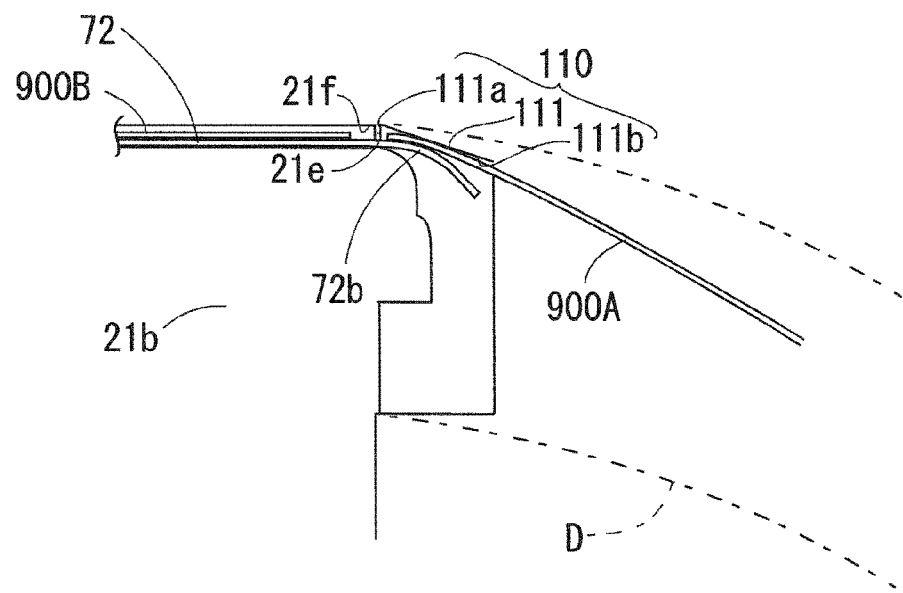
FIG. 14C is a view illustrating the contacting and positioning member and the discharge guide member when usage of the first carrier tape is completed and the second carrier tape is conveyed thereto.

As illustrated in FIG. 14C, when all of the components are taken out from the first carrier tape 900A, in the first carrier tape 900A, the first carrier tape 900A separates from the first sprocket 61 and the tail end of the first carrier tape 900A is discharged from the tape discharging section 21e. At this time, since the first carrier tape 900A is pushed up by the bent section 72b and is pushed onto the ceiling guide surface 111b of the tape retaining section 111, the first carrier tape 900A maintains a regular position along the ceiling guide surface 111b of the tape retaining section 111.

Figure 14D:
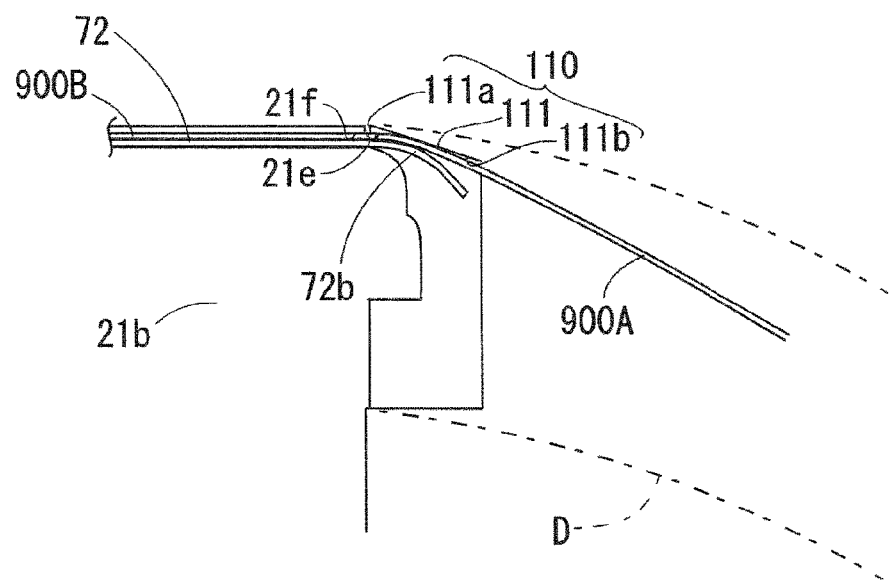
FIG. 14D is a view illustrating the contacting and positioning member and the discharge guide member when the leading end of the second carrier tape contacts the tail end of the first carrier tape.
Figure 14E:
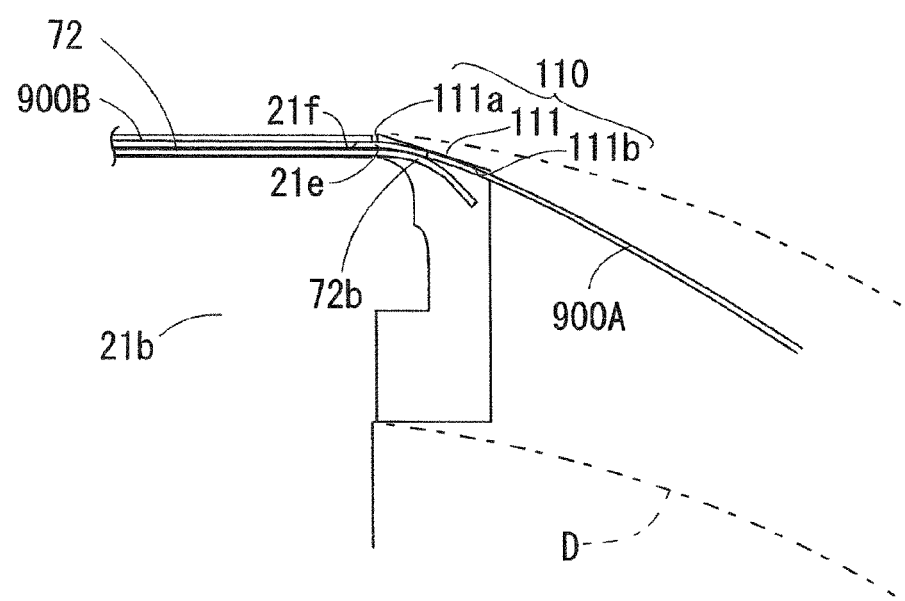
FIG. 14E is a view illustrating the contacting and positioning member and the discharge guide member when the first carrier tape is pushed out by the second carrier tape.
Figure 14F:
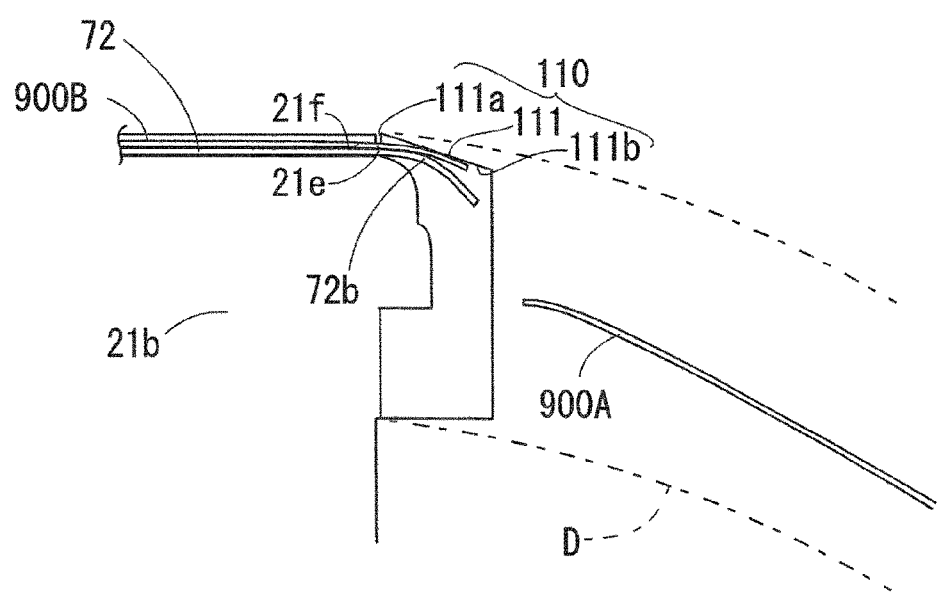
FIG. 14F is a view illustrating the contacting and positioning member and the discharge guide member when the first carrier tape is pushed out by the second carrier tape and falls.

As illustrated in FIG. 14D, since the first carrier tape 900A is positioned at the regular position along the ceiling guide surface 111b of the tape retaining section 111, the leading end of the second carrier tape 900B reliably contacts the tail end of the first carrier tape 900A. As illustrated in FIG. 14E, the first carrier tape 900A pushes out the second carrier tape 900B together with the rotation of the first sprocket 61. As illustrated in FIG. 14E, when the tail end of the first carrier tape 900A is separated from the bent section 72b, the first carrier tape 900A falls into the discharge duct D.

The leading end of the second carrier tape 900B is guided along the tape discharging section 21e and diagonally downward along the ceiling guide surface 111b of the tape retaining section 111 of the discharge guide member 110 and contacts the bent section 72b. The leading end of the second carrier tape 900B pushes down the bent section 72b against an elastic force and enters between the bent section 72b and the ceiling guide surface 111b of the tape retaining section 111.

The upper face of the second carrier tape 900B is guided by the ceiling guide surface 111b of the tape retaining section 111 and the lower face of the second carrier tape 900B is pushed up by the bent section 72b and the upper face of the second carrier tape 900B is pushed onto the ceiling guide surface 111b of the tape retaining section 111. Accordingly, the second carrier tape 900B is discharged downward inside the discharge duct D while maintaining a regular position along the ceiling guide surface 111b of the tape retaining section 111. Hereinafter, the same operations are repeated until the component mounting is completed.

(Effects)

The feeder 21 of the embodiment includes the feeder main body 21b in which the tape insertion section 21d for inserting the carrier tape 900 which stores multiple components and is covered by the cover tape 902 is formed at the rear portion of the feeder main body 21b and the tape discharging section 21e for discharging the carrier tape 900 is formed at the front portion of the feeder main body 21b, the tape conveyance path 38 which is provided on the feeder main body 21b to communicate the tape insertion section 21d and the tape discharging section 21e and is for conveying the carrier tape 900 from the rear toward the front, the rear side sprocket 64 which is provided on the feeder main body 21b to be capable of rotating, includes the engagement protrusions 64a which are capable of engaging with the engagement holes 901b of the carrier tape 900 which is inserted from the tape insertion section 21d, and sequential y conveys the current carrier tape 900A and the next carrier tape 900B along the tape conveyance path 38, and the front side sprocket 62 which is provided on the feeder main body 21b to be capable of rotating, includes the engagement protrusions 62a which are capable of engaging with the engagement holes 901b of the carrier tape 900 which is conveyed by the rear side sprocket 64, and once conveyance of the current carrier tape 900A to the tape discharging section 21e is completed, conveys the next carrier tape 900B which is conveyed thereto by the rear side sprocket 64 to the tape discharging section 21e.

The feeder 21 further includes the discharge guide member 110 which is provided on the feeder main body 21b to communicate with the tape discharging section 21e and guides such that the carrier tape 900 which is discharged from the tape discharging section 21e heads downward, the peeling member 71 which is provided on the feeder main body 21b and peels the cover tape 902 from the carrier tape 900 before the carrier tape 900 which is conveyed by the front side sprocket 62 reaches the tape discharging section 21e, and the contacting and positioning member 72 which is provided on the feeder main body 21b, causes the cover tape 902 which covers the carrier tape 900 which is conveyed by the front side sprocket 62 to contact the peeling member 71, and positions the carrier tape 900 from which the cover tape 902 is peeled and which is discharged from the tape discharging section 21e at a regular position inside the discharge guide member 110.

Accordingly, since it is possible to position the current carrier tape 900A for which usage is completed such that the tail end of the current carrier tape 900A for which usage is completed is capable of contacting the leading end of the next carrier tape 900B for which usage is to start inside the discharge guide member 110, it is possible to reliably discharge the current carrier tape 900A for which usage is completed.

The discharge guide member 110 guides the upper face of the carrier tape 900 and the contacting and positioning member 72 positions the carrier tape 900 at a regular position inside the discharge guide member 110 by pushing up the lower face of the carrier tape 900 to push the upper face of the carrier tape 900 onto the discharge guide member 110. Accordingly, since the upper face of the current carrier tape 900A for which usage is completed closely adheres to the ceiling guide surface 111b of the discharge guide member 110, it is possible to precisely position the current carrier tape 900A inside the discharge guide member 110.

The contacting and positioning member 72 is formed in a belt plate shape, causes the cover tape 902 to contact the peeling member 71 at a portion of the tape conveyance upstream side, and positions the carrier tape 900 at a regular position inside the discharge guide member 110 at the portion of the tape conveyance downstream side. Accordingly, since the contacting and positioning member 72 which uses both the peeling of the cover tape 902 and the positioning of the carrier tape 900 may be provided, a simple configuration is achieved and a decrease in cost is obtainable.

The contacting and positioning member 72 is formed such that an upstream side end portion of the tape conveyance upstream side is locked in the tape conveyance path 38 and a downstream side end portion of the tape conveyance downstream side extends more to the front than the tape discharging section 21e to enter the discharge guide member 110, and the contacting and positioning member 72 pushes up the lower face of the carrier tape 900 using a portion of the tape conveyance upstream side using the upstream side end portion as a fulcrum, causes the cover tape 902 to contact the peeling member 71, and pushes up the lower face of the carrier tape 900 using the downstream side end portion to position the carrier tape 900 at a regular position inside the discharge guide member 110. Accordingly, since the conveyance path of the carrier tape 900 from the peeling position of the cover tape 902 to the positioning position of the carrier tape 900 is a straight line, the leading end of the next carrier tape 900B for which usage is to start pushes out the tail end of the current carrier tape 900A for which usage is completed and is subsequently smoothly discharged without catching inside the discharge guide member 110.

The present disclosure is not limited to the configuration described in the embodiment and may adopt various aspects within a scope that does not depart from the gist of the present disclosure described in the claims.

REFERENCE SIGNS LIST

21 . . . feeder, 21b . . . feeder main body, 21d . . . tape insertion section, 21e . . . tape discharging section, 38 . . . tape conveyance path, 62 . . . front side sprocket, 64 . . . rear side sprocket, 62a, 64a . . . engagement hole, 71 peeling member, 72 . . . contacting and positioning member, 100 . . . component mounting machine, 110 . . . discharge guide member, 111 . . . tape retaining section, 111b . . . ceiling guide surface, 900 . . . carrier tape, 900A . . . current carrier tape, 900B . . . next carrier tape, 901b . . . engagement hole, and 902 . . . cover tape.

The invention claimed is:

1. A feeder comprising:
a feeder main body in which a tape insertion section for inserting a carrier tape which stores multiple components and is covered by a cover tape is formed at a rear portion of the feeder main body and a tape discharging section for discharging the carrier tape is formed at a front portion of the feeder main body;
a tape conveyance path which is provided on the feeder main body to communicate the tape insertion section and the tape discharging section and is for conveying the carrier tape from a rear toward a front;
a rear side sprocket which is provided on the feeder main body to be capable of rotating, includes engagement protrusions which are capable of engaging with engagement holes of the carrier tape which is inserted from the tape insertion section, and sequentially conveys a current carrier tape and a next carrier tape along the tape conveyance path;
a front side sprocket which is provided on the feeder main body to be capable of rotating, includes engagement protrusions which are capable of engaging with the engagement holes of the carrier tape which is conveyed by the rear side sprocket, and once conveyance of the current carrier tape to the tape discharging section is completed, conveys the next carrier tape which is conveyed thereto by the rear side sprocket to the tape discharging section;
a discharge guide member which is provided on the feeder main body to communicate with the tape discharging section and guides such that the carrier tape which is discharged from the tape discharging section heads downward;
a peeling member which is provided on the feeder main body and peels the cover tape from the carrier tape before the carrier tape which is conveyed by the front side sprocket reaches the tape discharging section; and
a contacting and positioning member which is provided on the feeder main body between the peeling member and the tape conveyance path, the contacting and positioning member pushes a lower face of the carrier tape to cause the cover tape to contact the peeling member and positions the carrier tape from which the cover tape is peeled to be discharged from the tape discharging section.

2. The feeder according to claim 1,
wherein the discharge guide member guides an upper face of the carrier tape, and
wherein the contacting and positioning member positions the carrier tape inside the discharge guide member by pushing up the lower face of the carrier tape to push the upper face of the carrier tape onto the discharge guide member.

3. The feeder according to claim 1,
wherein the contacting and positioning member is formed in a plate shape, and the contacting and positioning member causes the cover tape to contact the peeling member at a portion of a tape conveyance upstream side, and positions the carrier tape inside the discharge guide member at a portion of a tape conveyance downstream side.

4. The feeder according to claim 3,
wherein the contacting and positioning member is formed such that an upstream side end portion of the tape conveyance upstream side is locked in the tape conveyance path and a downstream side end portion of the tape conveyance downstream side extends more to the front than the tape discharging section to enter into the discharge guide member; and
wherein the contacting and positioning member pushes up the lower face of the carrier tape using a portion of the tape conveyance upstream side and using the upstream side end portion as a fulcrum, causes the cover tape to contact the peeling member, pushes up the lower face of the carrier tape using the downstream side end portion, and positions the carrier tape inside the discharge guide member.

5. The feeder according to claim 1, further comprising:
a first pair of springs that bias the contacting and positioning member towards the peeling member.

6. The feeder according to claim 5,
wherein the peeling member includes a blade that peels the cover tape from the carrier tape, and
wherein a first spring of the first pair of springs is upstream of the blade and a second spring of the first pair of springs is downstream of the blade.

7. The feeder according to claim 6, further comprising:
a second pair of springs that bias the contacting and positioning member towards the peeling member,
wherein the second pair of springs are downstream of the first pair of springs, and
wherein an elastic force of the second pair of springs is greater than an elastic force of the first pair of springs.

8. The feeder according to claim 1,
wherein an upstream side end portion of the contacting and positioning member is locked inside a groove provided in the tape conveyance path.

* * * * *